(12) United States Patent
Ballagh et al.

(10) Patent No.: US 6,883,147 B1
(45) Date of Patent: Apr. 19, 2005

(54) METHOD AND SYSTEM FOR GENERATING A CIRCUIT DESIGN INCLUDING A PERIPHERAL COMPONENT CONNECTED TO A BUS

(75) Inventors: Jonathan B. Ballagh, Longmont, CO (US); Roger Brent Milne, Boulder, CO (US); Jeffrey D. Stroomer, Lafayette, CO (US); Eric R. Keller, Boulder, CO (US); L. James Hwang, Menlo Park, CA (US); Philip B. James-Roxby, Longmont, CO (US)

(73) Assignee: Xilinx, Inc., San Jose, CA (US)

( * ) Notice: Subject to any disclaimer, the term of this patent is extended or adjusted under 35 U.S.C. 154(b) by 132 days.

(21) Appl. No.: 10/304,471

(22) Filed: Nov. 25, 2002

(51) Int. Cl.$^7$ ............................................. G06F 17/50
(52) U.S. Cl. .................. 716/1; 716/2; 716/12; 716/18
(58) Field of Search ........................... 716/1, 2, 12, 18, 716/4, 5; 703/14

(56) References Cited

U.S. PATENT DOCUMENTS 6,272,671 B1 * 8/2001 Fakhry ........................ 716/18
6,425,116 B1 * 7/2002 Duboc et al. ................ 716/18

* cited by examiner

*Primary Examiner*—Thuan Do
(74) *Attorney, Agent, or Firm*—LeRoy D. Maunu; Edel M. Young; Justin Liu

(57) ABSTRACT

Method and system for generating an electronic circuit design. A first logic block is instantiated in the design in response to user input controls. The first logic block includes parameters that specify its interface requirements. Bus interface blocks, which are parameterizable to connect a logic block to a bus, are provided in a library. Bus interface blocks that connect the first logic block to the bus are instantiated in the design, and the bus interface blocks are parameterized in response to the requirements of, the first logic block. The bus interface blocks are connected to the first logic block in such a way that the first logic block is extended into a peripheral that can communicate with the bus.

14 Claims, 13 Drawing Sheets

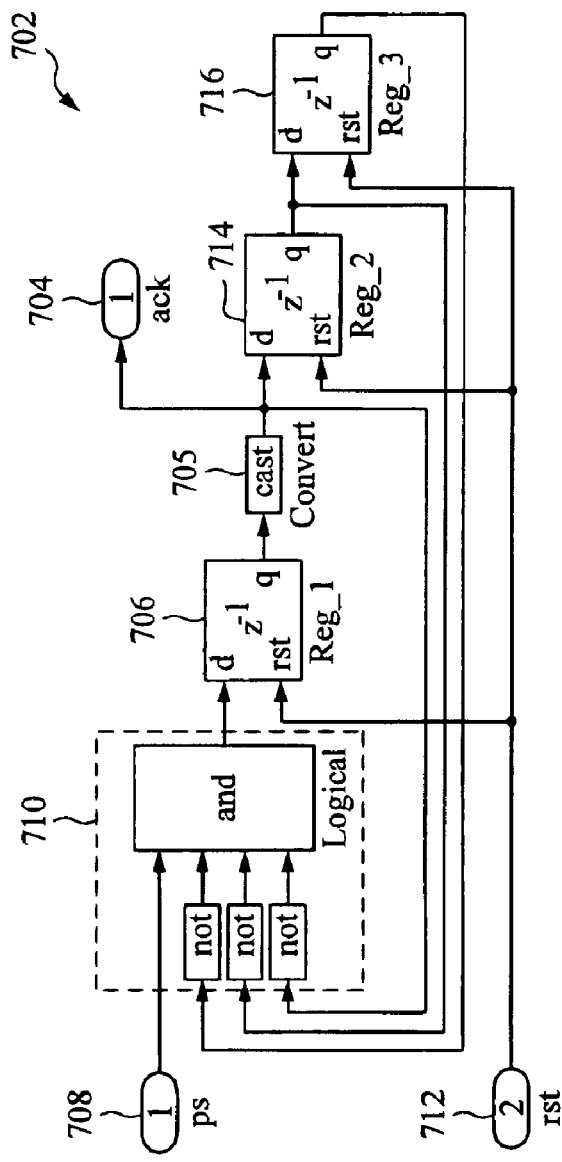
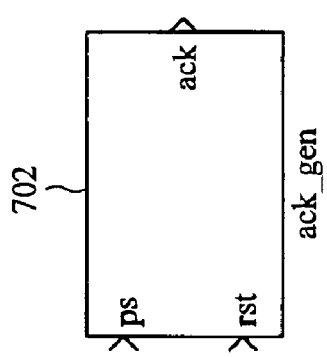
FIG. 10B
FIG. 10A

METHOD AND SYSTEM FOR GENERATING A CIRCUIT DESIGN INCLUDING A PERIPHERAL COMPONENT CONNECTED TO A BUS

FIELD OF THE INVENTION

The present invention relates to tools for creating circuit designs.

BACKGROUND

Modern electronic systems that are implemented in application-specific integrated circuits (ASICs), field-programmable integrated circuits (FPGAs), or complex programmable logic devices (CPLDs) are often extremely complex, requiring years of effort to realize. For this reason, it is common to decompose the design problem into phases: a specification phase in which the functional requirements of the system are defined, a modeling phase in which an executable version of the functional description is realized, and an implementation phase in which a hardware realization of the system is created. For the end result to be correct, each phase must faithfully implement the result of the previous phase. For example, the hardware realization must exactly mirror the functional model created during the modeling phase. In practice, validating that implementations are faithful, which is the greatest part of the design effort, often exposes design flaws or faulty assumptions upstream. This, in turn, results in reworking the earlier design representation.

The modeling phase consists of capturing the design in an executable form, simulating, then analyzing the results. The modeling phase is appropriate for algorithm exploration, in which system parameters such as sample rates, data precision, and choice of functional blocks are decided. This process is iterative, with the results of analysis leading to revisions that allow system specifications to be met. In the modeling phase, a high level of abstraction is desirable in order to facilitate algorithm exploration. For example, it is common to represent arithmetic values using floating point or fixed point rather than as buses of logic signals. Sampled data systems are also most conveniently modeled by defining sample rates rather than using explicit interconnections ("wires") representing clock and associated control signals (e.g., enable, reset).

The implementation phase consists of creating a low-level hardware realization of the system in terms of primitives in an appropriate technology library. Hardware description languages such as VHDL and Verilog are commonly used for such a representation. In this representation, high level constructs such as sample rates and arithmetic values must be implemented in terms of clock signals and buses of logic vectors, and functional operators (e.g., discrete Fourier transform) must be mapped into appropriate circuitry. To achieve high performance, libraries of intellectual property (IP) blocks are commonly used. Such IP blocks are typically custom built to be efficient in the target technology.

Electronic systems that include an embedded microprocessor or microcontroller are quite common. The processor is often coupled to peripherals that expand the functionality of the electronic system. Communication between the processor and peripherals traditionally takes place over a shared bus.

A typical design task is to take an existing IP block and integrate the block into the system by connecting the block to the bus. The block often requires additional interface logic that sits between the bus and the block. The interface logic enables communication between the bus and the block, and must be customized to meet the input/output (I/O) requirements of the block. In addition, the interface logic may need to be customized to meet certain requirements set forth in the system-level specification, e.g., to use a memory map address range allocated to the peripheral.

In some instances, a designer may understand the IP block but not know how to create the logic that connects the block to the bus. Solving the problem requires that the designer call on others for help or spend valuable time learning the bus protocol.

A system and method that address the aforementioned problems, as well as other related problems, are therefore desirable.

SUMMARY OF THE INVENTION

In various embodiments, the invention supports generating an electronic circuit design. A first logic block is instantiated in the design in response to user input controls. The first logic block includes parameters that specify I/O requirements. Bus interface blocks are provided in a library and are parameterizable. The bus interface blocks are used to connect a logic block to a bus. Interface blocks that connect the first logic block to the bus are instantiated in the design, and the interface blocks are parameterized in response to the requirements of the first logic block. Connections are made between the first logic block and the interface blocks, which allows the resulting circuit to be connected to the bus.

It will be appreciated that various other embodiments are set forth in the Detailed Description and claims which follow.

BRIEF DESCRIPTION OF THE DRAWINGS

Various aspects and advantages of the invention will become apparent upon review of the following detailed description and upon reference to the drawings in which:

FIG. 10A illustrates a block that encapsulates the handshake logic that controls the acknowledge signal for the peripheral component, and FIG. 10B illustrates the corresponding logic.

DETAILED DESCRIPTION

The various embodiments of the invention are directed to creating or modifying a circuit design in which a user-logic block is augmented with additional components that allow the user-logic block to communicate with a bus. These components are parameterized based on the requirements of the user-logic block. In one embodiment of the invention, a tool automatically instantiates the bus interface components, a user connects the components to the user-logic block, and the tool parameterizes the bus interface components based on the requirements of the user-logic block and the bus. In another embodiment, the bus interface components are automatically instantiated by the system and connected to the user-logic block.

An example system in which the various embodiments of the invention have been implemented is the system generator for DSP (Sysgen) tool from Xilinx, Inc., which is integrated with the Simulink/Matlab tools from Mathworks. Those skilled in the art will appreciate, however, that the present invention is adaptable to other systems.

An example is described in which a data path model is augmented with the logic necessary to extend the model into a peripheral component. The data path model is a reloadable FIR filter. The peripheral component, a processor, and an external host interface are connected to a shared bus. The processor controls data flow between an external host process and the peripheral component derived from the FIR filter. It will be appreciated that from the teachings for implementing the FIR filter peripheral component, other peripheral components that perform most any application-specific function can be easily created in similar fashion. Before presenting the example outlined above, an example design system in which the present invention may be used is described.

Figure 1:
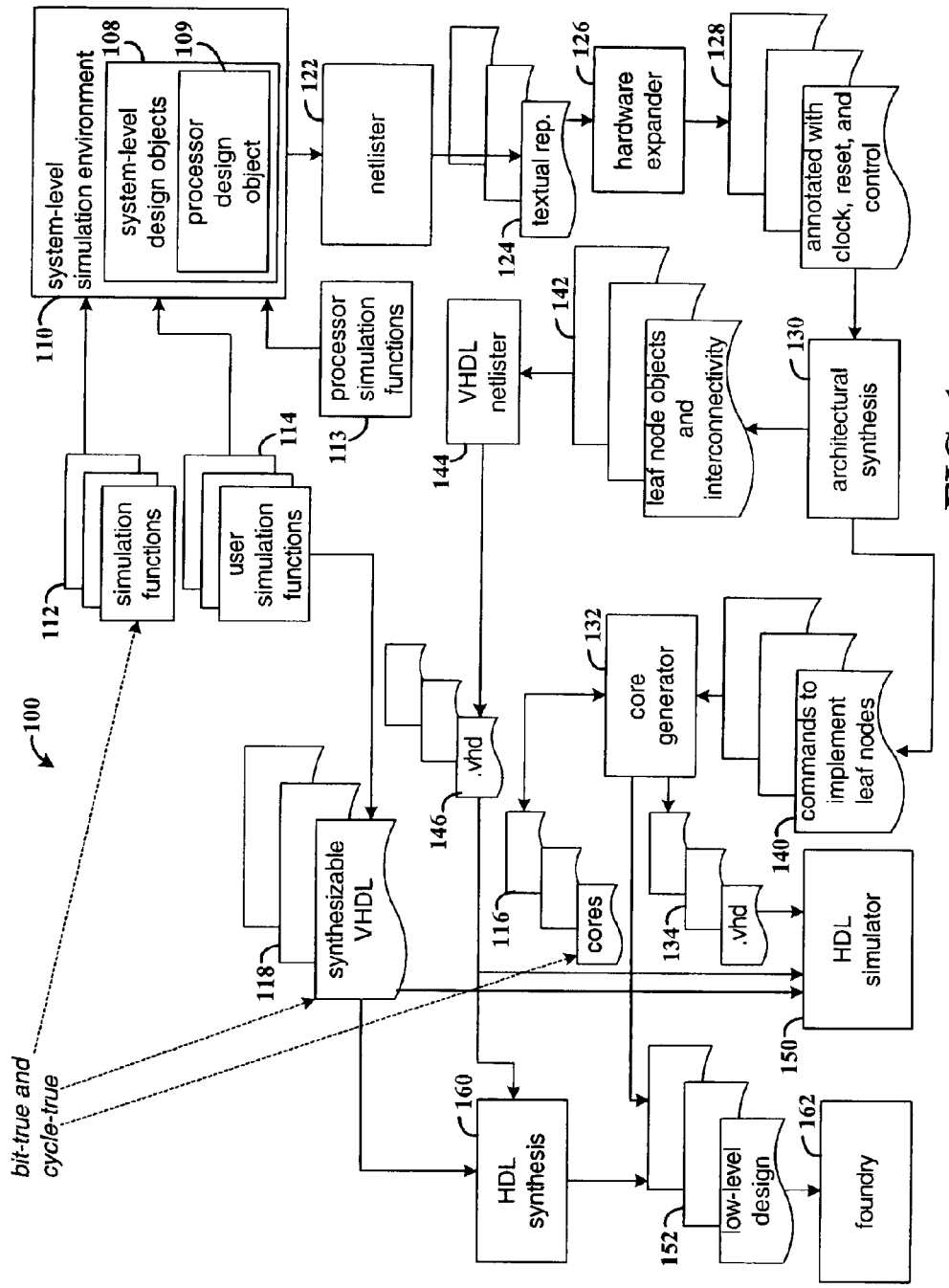
FIG. 1 is a functional block diagram of an example design system in which one embodiment of the invention may be used.

FIG. 1 is a functional block diagram of an example design system 100 in which one embodiment of the invention may be used. System 100 includes the system library (block 112), an embedded processor library (block 113), and blocks that perform the phases of compilation. The compiler phases include resolving system parameters into attributes in an internal representation (block 122); expanding data types and inferring clock ports, signals, and generators (block 126); performing architectural synthesis (block 130); and netlisting into an HDL representation (block 144). The target library (block 118) provides synthesizable circuitry that wraps IP blocks (block 116) to extend the functionality, e.g., support of fixed-point data.

In a specific example, system 100 illustrates how a Simulink® system model is transformed by a MATLAB function (netlister) into an internal representation. This internal representation undergoes several transformations that resolve system parameters into the required control circuitry and target library mapping. In particular, data types are resolved into hardware-realizable forms, and clock signals, flip-flop clock enables, and resets are inferred from system sample rates. A processor design object will typically provide an integer-based data path. The system level translation automatically resolves fixed-point data into the underlying integer-based microprocessor instructions.

It is advantageous to provide cycle-accurate modeling of hardware design objects. The processor/hardware design object interface can also be cycle-accurate, but it is also advantageous to support a sequence-accurate interface. In a sequenced interface, the data passed via a connection from a processor object to a hardware design object preserves the data sequence order, but does not necessarily accurately model in the system level simulation the actual elapsed time between data transfers. Although this mode of interaction is less accurate than a cycle-accurate simulation, it provides an abstraction that closely matches the semantics of most imperative programming languages, such as C and Java. For example, a sequence of assignments to a variable in a programming language defines a sequence of values stored in a particular memory location, but the precise clock cycles at which the assignments take place are not always a primary consideration. A sequenced interface is typically accompanied by an explicit synchronization circuit between the processor and hardware design objects. In one embodiment, the explicit synchronization circuit is a set of two memory mapped registers that implement a two-way handshake protocol between the processor design object and a hardware design object.

A user's design 108, including processor design object 109, is defined within a system-level simulation environment 110, such as Simulink®. Based on the user's design, the system-level simulator calls on simulation functions 112, along with user simulation functions 114 and processor simulation functions 113, to simulate the system-level design. The simulation functions 112, processor simulation functions 113, and user simulation functions 114 are configured to be bit-true and cycle-true relative to a hardware implementation. Thus, the bit-true and cycle-true characteristics of the simulation functions 112, 113, and 114 are reflected in the cores 116 and in the synthesizable VHDL 118, respectively. Simulation functions 112 are associated with system-provided design objects, processor simulation functions are those required to interface with the processor during simulation, and user simulation functions 114 are those provided by the user for simulating user-provided design objects.

Figure 2:
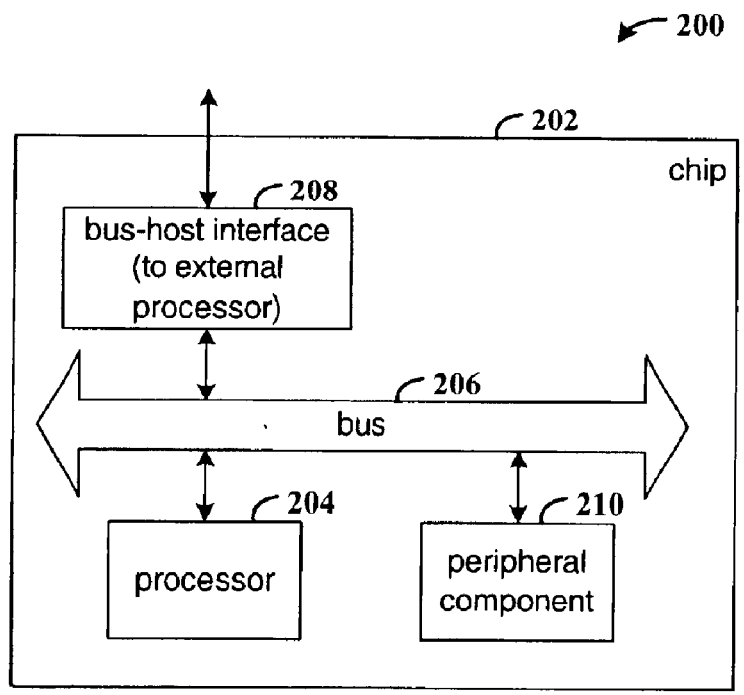
FIG. 2 is a functional block diagram of a circuit design in which a peripheral component has been connected to a bus.

FIG. 2 is a functional block diagram of an example circuit design in which a component (the "user-logic block") has been extended into a peripheral component and connected to an on-chip bus. The circuit design is intended to illustrate an example arrangement in which a user-logic block has been added to the design and adapted for connection to the bus. Design 200 includes chip 202, on which are implemented processor 204, bus 206, bus-host interface 208, and peripheral component 210. In a specific example, chip 202 is an FPGA from Xilinx, and processor 204, bus 206, bus-host interface 208, and peripheral component 210 are implemented on the FPGA. The peripheral component 210 is generated from IP blocks or "library elements" that are available in a design tool such as Sysgen. It will be appreciated that the present invention is not restricted to designs in which the peripheral component communicates to an on-chip bus. That is, the peripheral component may also communicate with an off-chip bus on a backplane or separate chip. The example functions provided by peripheral component 210 and described below are presented for providing context for the description that accompanies FIGS. 5A–15B. The example peripheral component 210 includes a reconfigurable digital filter, some filter-related control logic, and assorted logic for interfacing with bus 206. Bus-host interface 208 provides communication between a host computer arrangement (not shown) and the peripheral component. In an example application, the host computer initiates filter reloading and transfers new filter coefficients to processor 204. Upon receiving new coefficients from the host, the processor controls the filter reloading from within the FPGA.

A hardware realization of design 200 operates in two modes: filter reloading and filter frame data transfer. When the filter (i.e., the peripheral component) is not being reloaded, frames of filter output are transferred over the bus to processor 204. The frames are then sent from the processor on bus 206 to a host computer for analysis. On the host, the user may construct a new filter and transfer new coefficients to the processor via bus interface 208 and bus 206. Upon receiving the coefficients, the processor transfers the coefficients to the peripheral component.

Figure 3A:
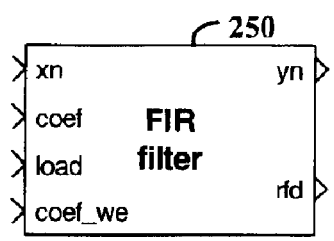
FIG. 3A illustrates an example FIR logic block available to a designer as an abstract, user-selectable library element.

FIG. 3A illustrates an example FIR filter logic block 250 available to a designer as an abstract, user-selectable library element in a system such as Sysgen. Tools such as Sysgen work well in modeling high performance custom signal processing data paths. To illustrate how to extend a data path into a peripheral component, the reconfigurable filter 250 is used as an example. The library element that defines the filter includes control logic that manages coefficient reloading, adjusts data rates, and controls filter output frame buffering.

The library element that defines the filter also supports parameterization of the coefficient precision, coefficient binary point, number of taps, and filter oversampling rate. The example filter is configured with 32 taps, 12-bit coefficient precision, and reloadable coefficients.

Briefly, the filter operates as follows. When the filter is not being reloaded, input values drive the xn port and filter output values drive the yn port. Filter reloading is initiated with a pulse on the load port, load. During reload, the rfd port outputs zeros to indicate the filter is busy. Following the load pulse, new coefficients are written to the coef port. Asserting coef_we identifies the current value on the coef port as valid. After all coefficients are written, the filter comes back online some number of cycles later and resumes processing data. The filter signals that coefficient reloading is complete by asserting the rfd signal.

Figure 3B:
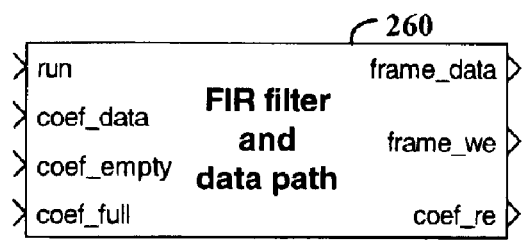
FIG. 3B illustrates an example logic block that includes the FIR logic block along with the data path for interfacing with the FIR logic block.

FIG. 3B illustrates an example logic block 260 that includes the FIR filter logic block along with the data path for interfacing with the filter logic block. The filter block is augmented with control logic to allow the data path to communicate with the peripheral's memory mapped register and FIFO interface (FIG. 4B). In one embodiment, the control logic is inferred and synthesized automatically by the tool. In another embodiment, the control logic is built to conform to user specifications. Even though understanding of the details of the filter operation is not required for understanding the present invention, some details are presented herein for the purpose of providing background for the specific examples that are presented in FIGS. 5A–15.

The control logic enables the data path as follows. The data path monitors the status of a 1-bit run control register in the peripheral's memory map interface. The value of this register is driven to the filter 260 through the run port. When the register is set to 1, contiguous filter output values are written to a FIFO that resides in the memory map interface. The FTFO write enable signal is driven by the data path's frame_we port. When the register is set to 0, no values are written to the FIFO. This control register allows the processor to manage data flow from the peripheral to the bus. A full FIFO constitutes one frame of filter output data.

The filter's data input port is driven with an impulse train. The impulse train is generated using a counter/comparator pair (not shown) that produces a pulse each time the counter rolls over. The maximum count is chosen to be larger than the number of filter taps. The cast block converts the relational block's Boolean (1-bit) output into a 12-bit input value that drives the filter's data input port.

New filter coefficients written to the peripheral by the processor are stored in a second memory mapped FIFO (not shown). It is the data path's responsibility to monitor the coefficient FIFO signals driven on input ports coef_empty and coef_full. When the FIFO is full (indicating all coefficients have been written) the data path initiates a filter reload sequence and issues read requests to the FIFO to obtain the new coefficients. The coefficient FIFO read request is driven on the coef_re output port.

To conserve hardware, filter 260 is configured to oversample by a rate of 4. The oversampled filter runs at the system rate (i.e., the same rate as the bus clock), and therefore the filter data rate is 4 cycles per sample. Clock enable probes extract the clock enable pulses used in multirate designs so that FIFO reads/writes align to the filter input sample frame.

Figure 4A:
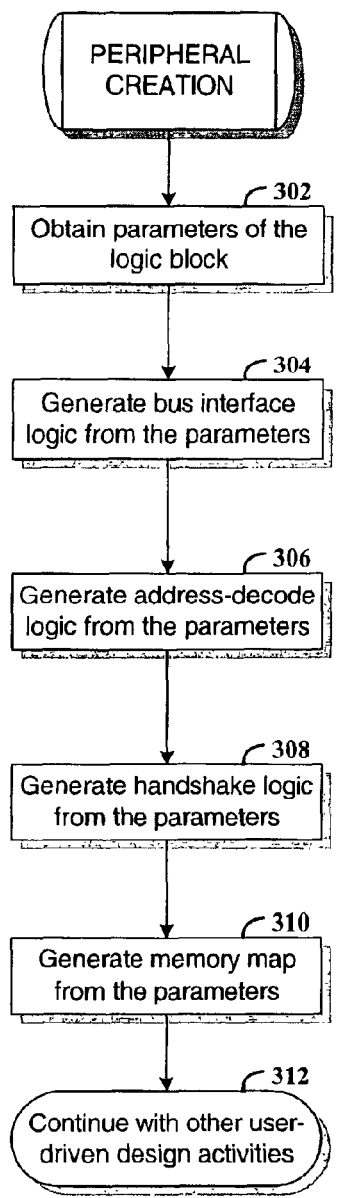
FIG. 4A is a flowchart of a process for creating a peripheral component for connection to a bus in accordance with one embodiment of the invention.
Figure 4B:
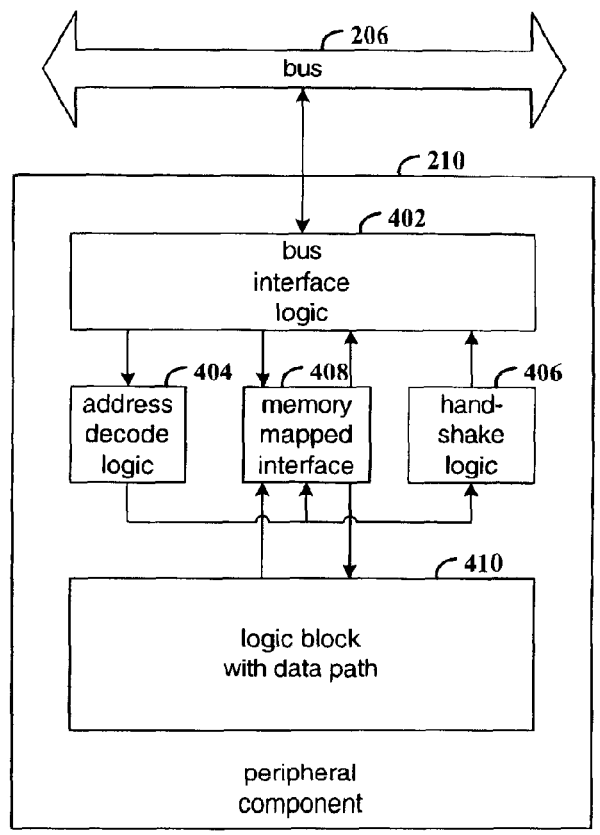
FIG. 4B is a functional block diagram of a circuit design in which bus interface logic blocks are connected to a user-logic block.

FIG. 4A is a flowchart of a process for creating a peripheral component and connecting the component to a bus in accordance with one embodiment of the invention. It should be understood that the steps could be implemented in an order other than that shown in the figures and further described below. The illustrated order is for discussion purposes only.

The process generally entails generating various logic blocks for connecting an abstract peripheral component library element, including a defined data path, to a bus In addition to a data path, a peripheral component generally requires the bus interface logic, address decoding logic, a memory-mapped register interface to the I/O ports of the data path, and logic to manage handshake signals associated with bus transactions. For purposes of modularity, each of the foregoing components have been encapsulated, for example, in a separate Simulink subsystem. Using subsystems allows each component to be conveniently added and retrieved from a component library.

FIG. 4B is a functional block diagram of a circuit design in which bus interface logic blocks are connected to a user-logic block. FIGS. 5A–14B and the accompanying description illustrate the details of example subsystems used to connect a component to an example bus. From these teachings it will be appreciated that generation and connection of similar bus interface subsystems to the user-logic block could be automated by a system-level design tool to suit the requirements of other user blocks and bus protocols.

Turning now to FIG. 4A, the parameters of the data path of the user-logic block that is to be connected to the bus are used in generating the specific bus interface logic, address decode logic, memory-mapped interface, and handshake logic (step 302). The requirements of the user-logic block must be defined in order to extend the user-logic block into the peripheral component.

In one embodiment, these requirements may be specified as attributes on the input and output gateways of the user-logic block at points where it is desired to have the data path communicate with the bus. Such requirements may include, but are not limited to, selection of register, FIFO, shared memory, memory depth, and transaction latency. These requirements can be selected through pull down menus, text input fields, or specialized component instances from a library. The gateway interface is automatically modified based on the user-selected parameters. For example, if configured as a FIFO, the gateway interface exposes FIFO control signal ports that interface with the user logic block.

The requirements, in turn, define the bus signals that must be interfaced to the user-logic block, the decoding logic, handshaking logic, and memory-mapped interface structure. The decoding logic depends not only on the user-logic block's requirements, but also on the memory address range allocated to the peripheral component. The handshaking logic is traditionally comprised of state-machines that act in accordance to a particular bus transaction protocol. The memory-mapped interface interacts directly with the user-logic block. Specifically, the memory-mapped interface is made up of memory elements, including registers and FIFOs, that are assigned a unique address.

The bus interface logic, address decode logic, memory-mapped interface, and handshake logic library elements are parameterizable using the parameters of the peripheral component. For example, the bus interface subsystem can be parameterized by setting a latency parameter to enable or disable signal registering for signals coming to and from the bus. The memory-mapped interface might be defined in terms of which types of memory elements are required to support communication with the data path, the depth of each memory element, the corresponding control signals associated with each memory element, and the corresponding address offsets of each port. The handshake logic may be defined by selecting the desired bus protocol of the system, the latencies of various transactions, and choosing the possible bus transaction types. The address decode logic can be defined in terms of the address signal bit-width and base address of the peripheral.

The bus interface logic, address decode logic, memory-map, and handshake logic blocks are automatically instantiated and parameterized using the parameters of the user-logic block and any additional parameters provided by the designer.

In one embodiment of the invention, the parameterized bus interface blocks are placed in a library. The blocks are connected to the user-logic block in response to user controls, which provides the user some level of control over the low-level circuit implementation.

In another embodiment, the bus interface blocks are automatically synthesized and connected to the user-logic block by the tool during the hardware translation phase. The automatically generated blocks are hidden from the designer to support an even higher level of design abstraction. The synthesis requires that the design identify the bus or type of bus to which the peripheral is to be connected. The synthesis then uses a pre-defined bus definition to synthesize the bus interface blocks.

From the parameters of the peripheral component, the bus interface logic 402 (FIG. 4B) is generated (step 304, FIG. 4A). The bus interface logic bridges the gap between the peripheral's I/O ports and the bus. The bus interface logic is encapsulated in a subsystem, which provides a convenient abstraction of the bus. In the embodiment in which a user connects the interface blocks to the user-logic block, a user can easily tap off signals from the bus interface. Input and output gateways are coupled with the subsystem logic, in, for example, Sysgen, to ensure the necessary ports are instantiated on the top-level peripheral VHDL when the model is translated into hardware.

Figure 8:
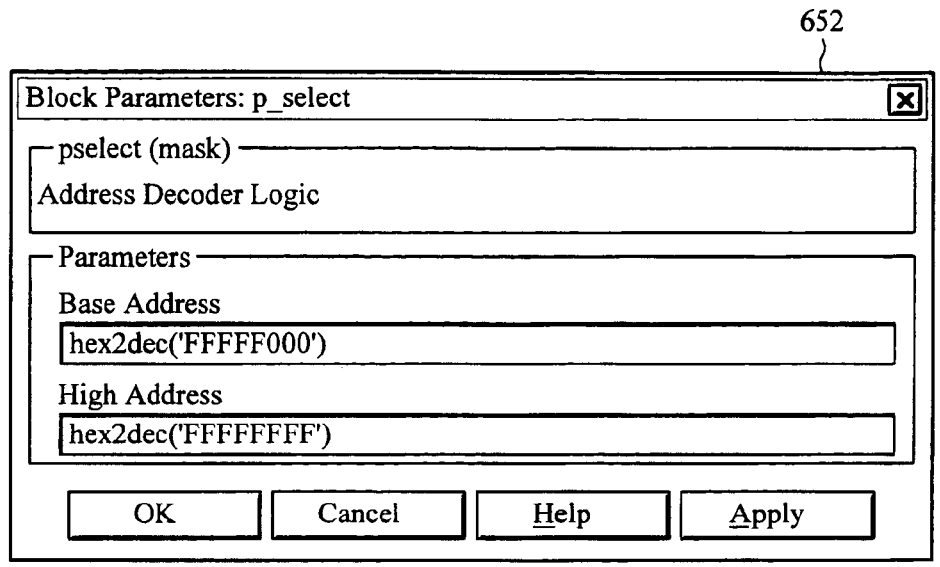
FIG. 8 illustrates a graphical user interface (GUI) screen for obtaining address space parameters for a peripheral component.
Figure 9:
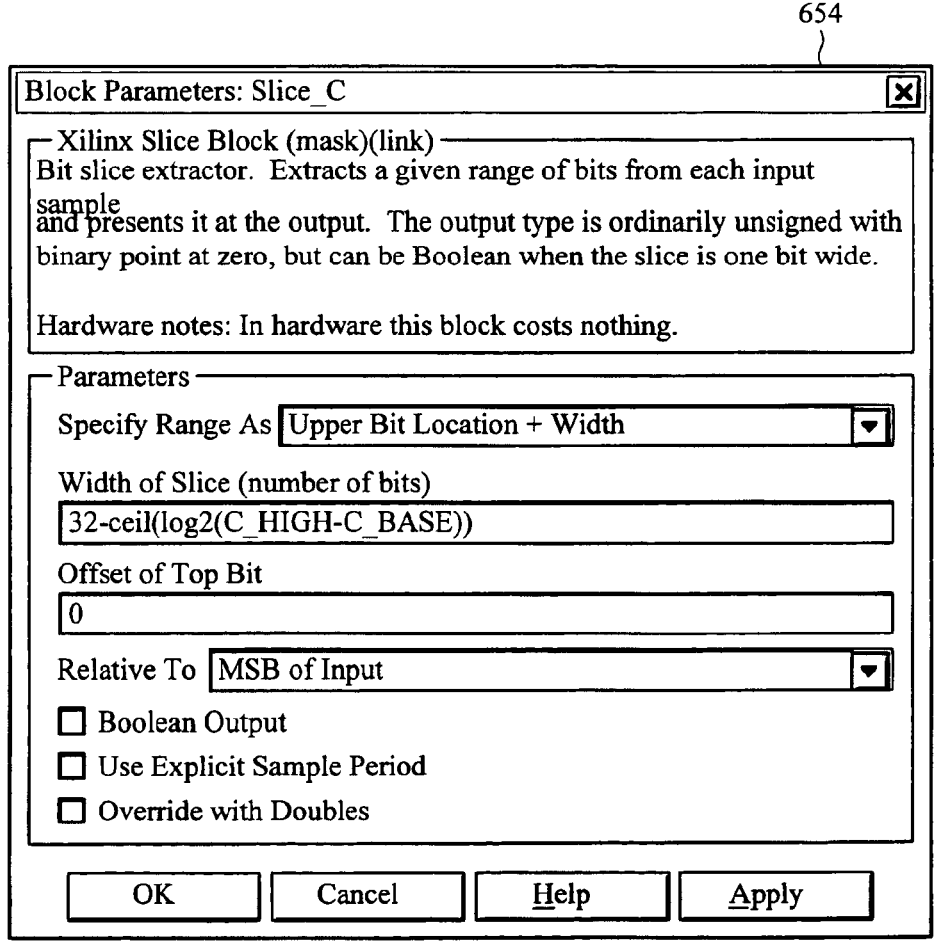
FIG. 9 illustrates a graphical user interface (GUI) screen for obtaining parameters that define the bit-slice extractor.

The peripheral component is responsible for decoding addresses appearing on the bus and determining whether the address is within the peripheral component's mapped memory space. This function is performed by the address decode logic 404, which is generated from the parameters of the user-logic block (step 306). Some example parameters are shown in FIGS. 8 and 9.

The tool must generate custom logic to manage handshaking between the bus and the peripheral. The handshake logic 406 is generated from the parameters associated with the user-logic block (step 308). The tool must analyze these parameters to derive new parameters specific to the handshaking control logic. Example parameters may include, but are not limited to, the maximum number of clock cycles available for the user-logic block to acknowledge a transaction, whether or not error conditions can occur in the user-logic block during a transaction, and the respective latency periods required for read/write transactions. Most importantly, the tool must be aware of the target bus as provided in a system implementation parameter.

The memory map interface 408 is generated (step 310) to handle passing of data between the user-logic block and the bus. In an example embodiment, the memory mapped interface assigns each port of the library element 410 to an offset from a base address assigned to the peripheral component. The offset is used as an index into a set of registers within the memory mapped interface. It will be appreciated that library element 410 corresponds, for example, to filter 260 of FIG. 3B.

The bus interface logic has been separated into two subsystems, one for signals driven to the peripheral component by the bus and another for signals driven by the peripheral component to the bus for ease of explanation.

Figures 5A, 5B:
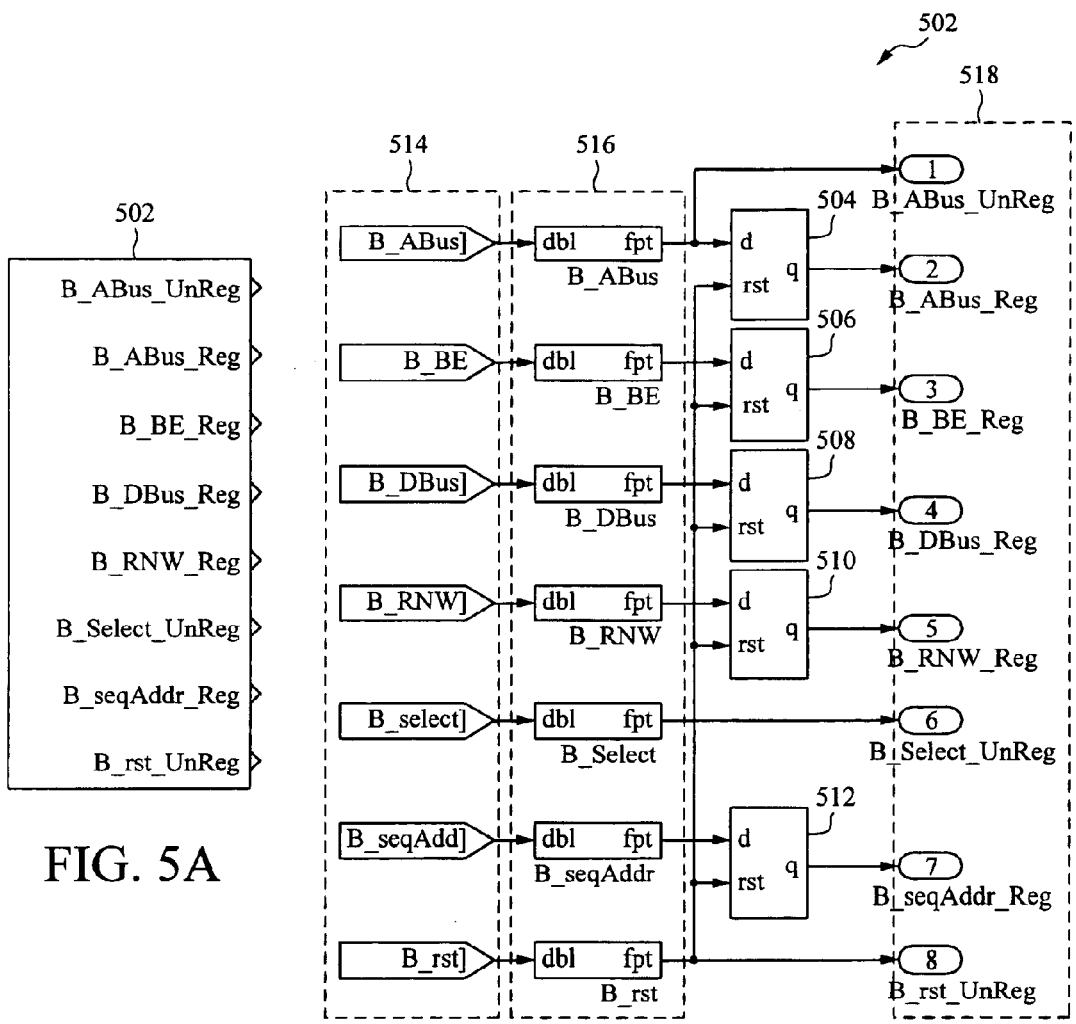
FIG. 5A illustrates a block 502 that encapsulates the portion of the bus interface logic for driving signals from the on-chip bus to the data path of a logic block.
FIG. 5B illustrates the corresponding data path.

FIG. 5A illustrates a block 502 that encapsulates the portion of the bus interface logic for driving signals from the chip bus to the data path of a logic block, and FIG. 5B illustrates the corresponding data path. The signals that are read from the OPB are stored in registers 504, 506, 508, 510, and 512. These registers can be removed if the peripheral timing constraints can be relaxed. Each register in the subsystem has an explicit reset port exposed. Registering of the input signals can be controlled through block parameters. By routing the B_rst signal to each register's reset port, the contents of these registers will be reset to an initial value if the OPB reset is asserted.

The elements in block 514 are global from blocks that are sources for the gateway blocks 516. Global from blocks allow gateway blocks to be driven without needing explicit ports on the subsystem interface. During simulation the processor subsystem drives the from blocks using global goto blocks. Block 518 illustrate the input ports to the peripheral component.

The input and output subsystems 502 and 552 should be placed in the top level of the hierarchy for the peripheral component. Note that every gateway is named after a corresponding bus port and is assigned a width that matches that of the bus port. The gateway naming is automated by the tool.

Figure 6A:
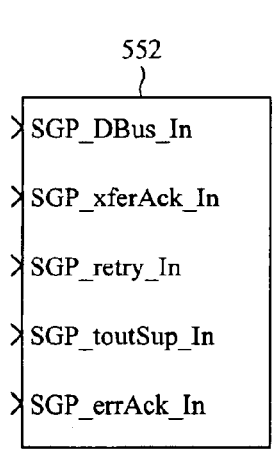
FIG. 6A illustrates a block 552 that encapsulates the portion of the bus interface logic for driving signals from the data path of a logic block to the bus.
Figure 6B:
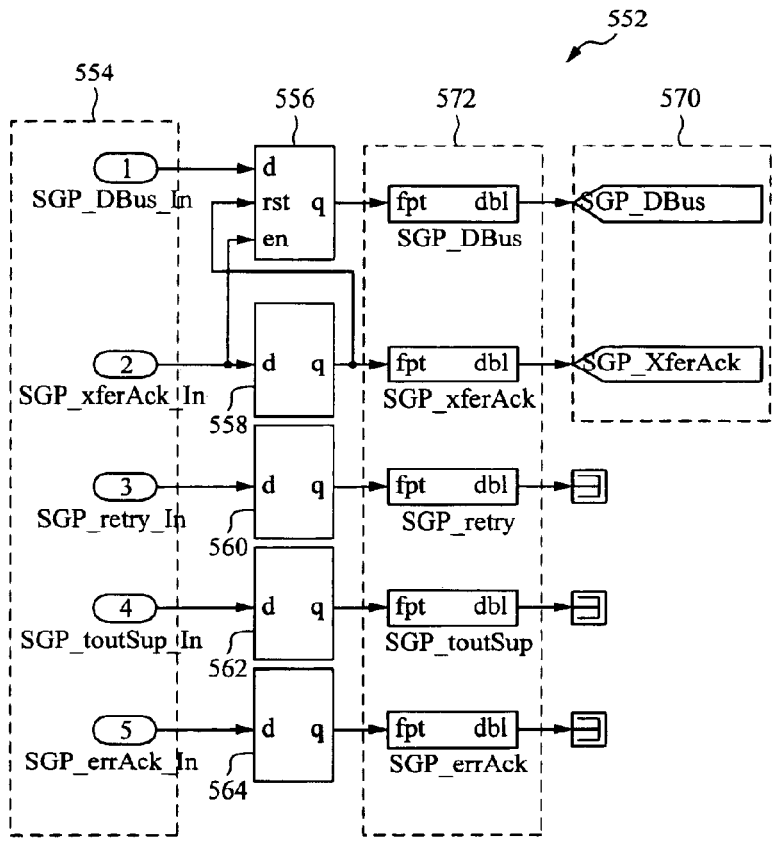
FIG. 6B illustrates the corresponding data path.

FIG. 6A illustrates a block 552 that encapsulates the portion of the bus interface logic for driving signals from the data path of a logic block to the bus, and FIG. 6B illustrates the corresponding data path. The output signals from the peripheral component (ports 554) are registered (registers 556, 558, 560, 562, and 564) before being written to the bus. These register blocks can be removed if peripheral timing is relaxed. Global goto blocks 570 follow the gateway-out blocks 572 and allow the processor subsystem to monitor the peripherals output signals without explicit wiring. Note the reset port on the SGP_DBus register is driven by the registered acknowledge signal. This wiring ensures the peripheral data output register to be reset to zero on the cycle immediately following the assertion of the acknowledge signal. This satisfies the requirement for the peripheral component to drive zeros to the bus when the acknowledge is low. The bus signals that are terminated are not used in this example.

Figure 7A:
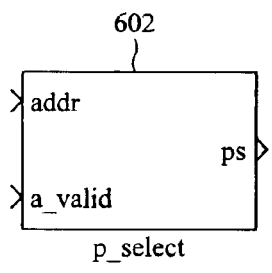
FIG. 7A illustrates a block 602 that encapsulates the logic that decodes addresses appearing on the on-chip bus.
Figure 7B:
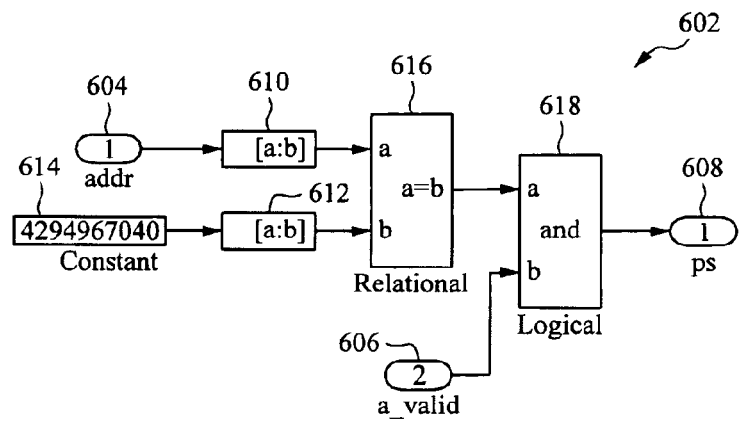
FIG. 7B illustrates the corresponding logic.

FIG. 7A illustrates a block 602 that encapsulates the logic that decodes addresses appearing on the on-chip bus, and FIG. 7B illustrates the corresponding logic. The bus master indicates a valid address value by asserting a select signal. This means the peripheral need only decode the current address when the select signal is high. The address decode subsystem 602 has two input ports, addr port 604 and a_valid port 606. The addr port is driven by the bus address signal, and the a_valid port of the subsystem is driven by the select signal from the bus. The ps output port 608 drives the peripheral select signal for the model.

Slice blocks 610 and 612 extract the relevant bits of the address signal. The slice blocks should be configured with a range defined as an offset from the MSB. The constant block 614 stores the entire base address of the peripheral. The relational block 616 tests for equality between the outputs of the two slice blocks. Logical block 618 is configured to perform an and operation to ensure that the peripheral select output ps is only asserted when the address is valid, as indicated by the a_valid signal. Note the p_select subsystem implementation assumes the memory map allocation range is an even power of two.

FIG. 8 illustrates a graphical user interface (GUI) screen 652 for obtaining address space parameters for a peripheral component. The GUI is shown for instructive purposes only, as the tool itself would bypass the GUI when setting the block parameters. The address-decode subsystem 602 is further enhanced by making it a masked subsystem. The subsystem is parameterized in terms of the desired base address and high address values. The base and high address values are passed to mask parameters C_BASE and C_HIGH respectively.

FIG. 9 illustrates a graphical user interface (GUI) screen 662 for obtaining parameters that define the bit-slice extractor. The constant and slice blocks are parameterized using the C_BASE and C_HIGH parameters.

FIG. 10A illustrates a block 702 that encapsulates the handshake logic that controls the acknowledge signal for the peripheral component, and FIG. 10B illustrates the corresponding logic. A slave peripheral component that is being read or written to on the bus generates an acknowledge pulse on port 704 once it has completed the transaction. The acknowledge pulse is accompanied by valid output data for a read from the peripheral component. The pulse is driven to the SGP_xferAck signal of the bus. The cast block 705 explicitly defines the signal type in the presence of a feedback loop.

In the example peripheral component, each read and write has a fixed and equal latency. Although a state machine is an equally valid alternative, register 706 produces the pulse in the example embodiment. The tool will produce either implementation depending on the user-logic block requirements. The input data to register 706 is driven by the select signal (port 708) with logic 710 to ensure the register resets on the cycle following its assertion with the reset signal from port 712.

Two additional registers 714 and 716 introduce a two-cycle latency in the acknowledge so that the pulse aligns with the peripheral output data. The three register outputs are fed back and are used to set the register to zero if any register output is a one. This logic is necessary because the peripheral select signal remains high for several cycles. The acknowledge signal, however, must only be asserted for a single cycle.

Figures 11A, 11B:
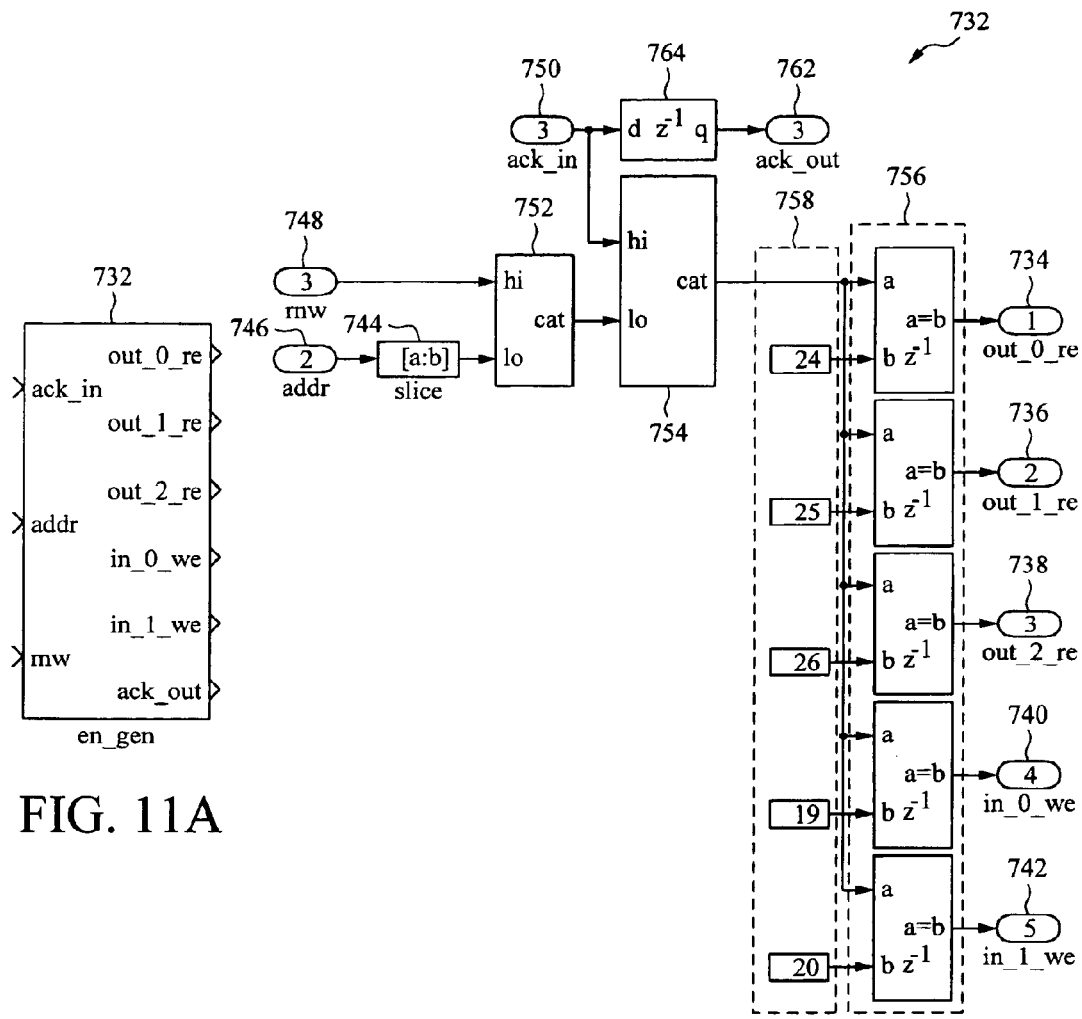
FIG. 11A illustrates a block 732 that encapsulates the logic that generates the enable signals for memory mapped register and FIFO components of the peripheral component.
FIG. 11B illustrates the corresponding logic.

FIG. 11A illustrates a block 732 that encapsulates the logic that generates the enable signals for memory mapped register and FIFO components of the peripheral component, and FIG. 11B illustrates the corresponding logic. The five I/O ports (734, 736, 738, 740, and 742) of the data path pertinent to this example are labeled out_0_re, out_1_re, out_2_re, in_0_we, and in_1_we. Example address values assigned to the ports are illustrated in Table 1.

TABLE 1

| Signal | Description | Transfer | Offset |
| --- | --- | --- | --- |
| out_0_re | Data | Read | 0 × 0 |
| out_1_re | Buffer Full | Read | 0 × 4 |
| out_2_re | Buffer | Read | 0 × 8 |
| in_0_we | Run/Stop | Write | 0 × C |
| in_1_we | Coefficient | Write | 0 × 10 |

Decoding logic is included in the peripheral to generate the enable signals for each memory mapped register/FIFO component. A slice block 744 extracts the relevant bits from the address signal (port 746). In the example, the addresses are aligned to the full 32-bit word boundaries. Therefore the two least significant bits of the address signal are ignored because they are not needed for data steering. The rnw signal (port 748) and peripheral acknowledge (port 750) signals are concatenated (blocks 752 and 754) with the extracted address bits. The resulting signal drives the first input port of a series of comparators 756. Respective constant blocks 758 drive the second input port of the comparators. The constant value is derived by using the memory mapped element's offset value along with the read/write status and assumes an asserted acknowledge. The enable signals are wired to the enable ports of the respective memory mapped components. The acknowledge output signal (port 762) is the input acknowledge signal (port 750) with a delay of 1 (block 764).

Figure 12A:
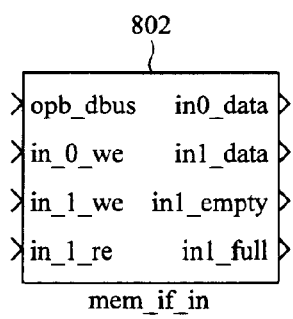
FIG. 12A illustrates a block 802 that encapsulates logic that implements an example input memory map for a peripheral component.
Figure 12B:
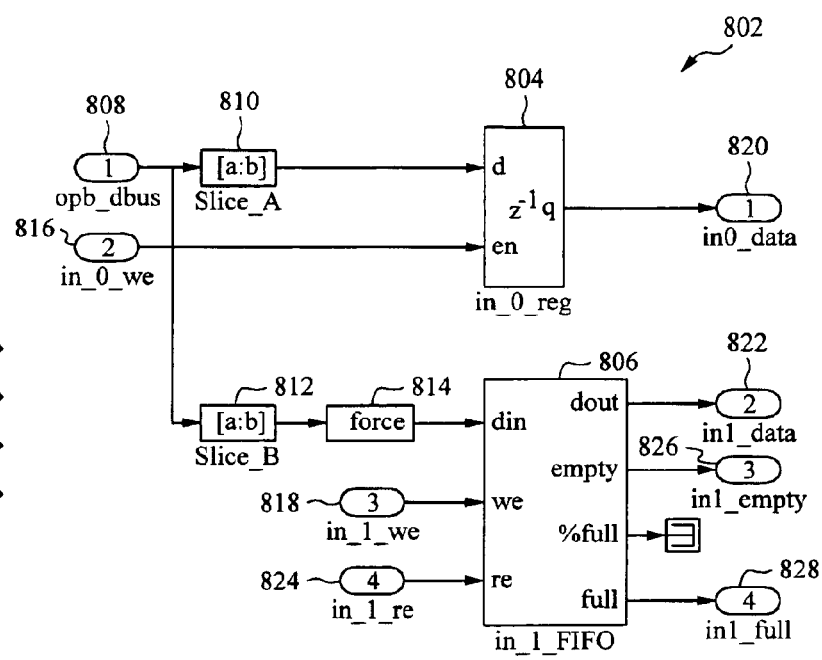
FIG. 12B illustrates the corresponding logic.

FIG. 12A illustrates a block 802 that encapsulates logic that implements an example input memory map for a peripheral component, and FIG. 12B illustrates the corresponding logic. A standard memory mapped input interface is comprised of register and FIFO blocks; both of which are modeled and available in the Xilinx BlockSet. The input memory map for the peripheral component is implemented using a register block 804 for the run control register and a FIFO block 806 for filter coefficient buffering. Both the register and FIFO data inputs are driven by the bus data input signal (port 808). Slice blocks 810 and 812 are placed on both data input signals before the block inputs. For the run control, only a single bit is required for the control; 32 single bit registers are not needed to store the bus data. Slice block 810 extracts the LSB from the data bus and generates a Boolean output signal. Similarly, slice block 812 extracts the 12 bits needed to store each filter coefficient. However, the precision produced by the slice block is incompatible with the filter coefficient precision required by the FIR filter. That is, the slice block generates an unsigned 12-bit number with zero factional bits, but the parameterization of the DA FIR block requires signed 12-bit values with 11 fractional bits. To make this conversion, force block 814 is placed immediately after the slice block 812. The force block does not require additional hardware resources and is only used to allow Simulink to correctly interpret and scale the coefficient data value.

Many Sysgen blocks provide explicit enable and reset controls. These ports are mapped to the enable and reset ports in the synchronous hardware elements when the model is translated into hardware. These ports are used in the memory map to control when the register and FIFO blocks are written. An explicit enable signal is exposed on the register block and is driven by its respective we signal (port 816) from the address decoding logic. Similarly, the FIFO block's we port is driven by the corresponding we signal (port 818). Data are read from the register block and FIFO block via ports 820 and 822, with the read enable signal for the FIFO block at port 824. The signal at port 826 indicates when the FIFO is empty, and the signal at port 828 indicates when the FIFO is full.

Figures 13A, 13B:
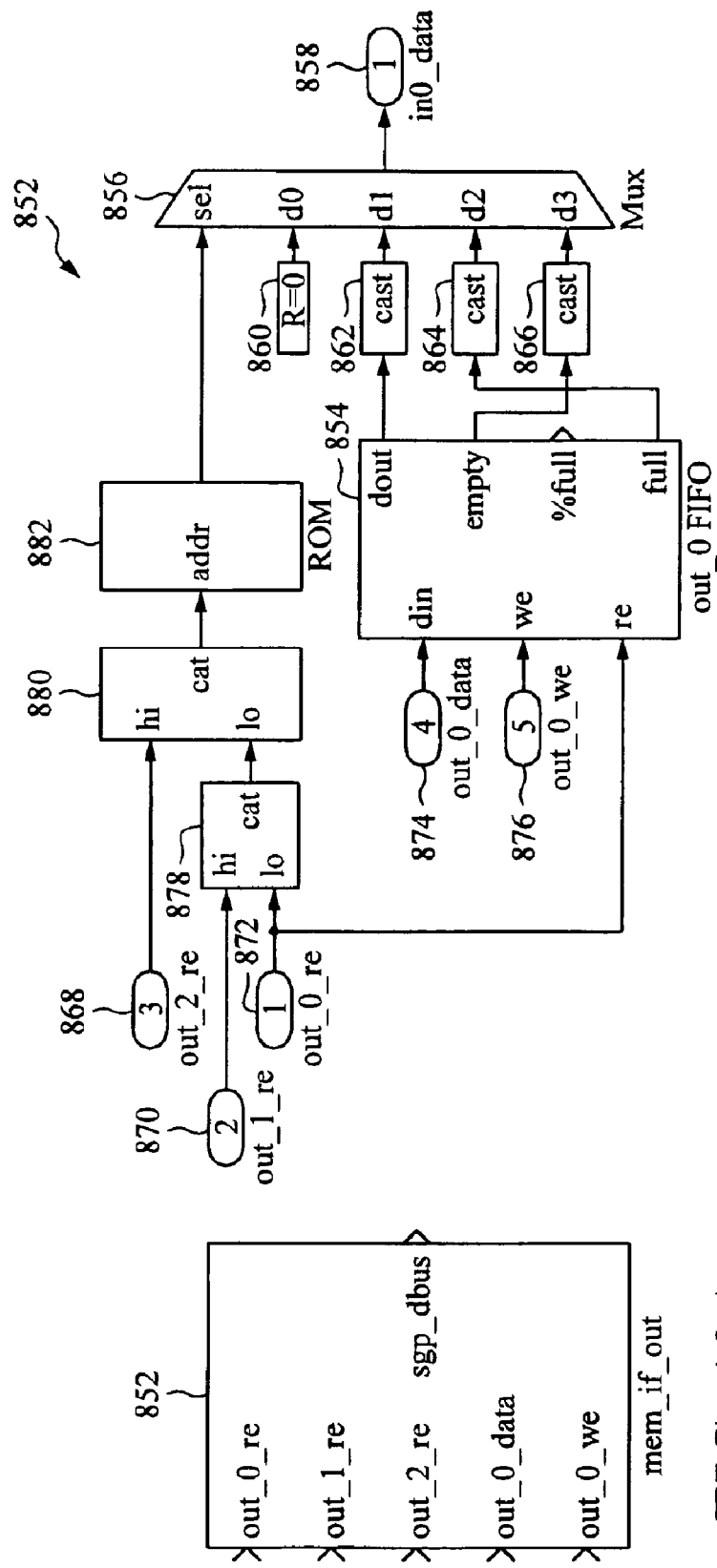
FIG. 13A illustrates a block 852 that encapsulates logic that implements an example output memory map for a peripheral component.
FIG. 13B illustrates the corresponding logic.

FIG. 13A illustrates a block 852 that encapsulates logic that implements an example output memory map for a peripheral component, and FIG. 13B illustrates the corresponding logic. The output memory map interface is comprised of a FIFO 854 with multiplexing logic 856 to switch between FIFO output signals. The output memory map must drive zeros to the bus data output signal (port 858) if the master is not attempting to read from one of these three signals.

When a read request is issued to the peripheral component and the address corresponds to one of the FIFO output three signals, data, empty, and full, valid data must be driven to the bus data signal. The timing of the data must be such that the valid data is driven to the bus in the same cycle that the acknowledge signal is asserted. The peripheral component should drive zeros at all other times to avoid contention on the bus.

Multiplexer block 856 is configured with 4 inputs and switches between constant (block 860) zeros and the FIFO outputs. The FIFO outputs have different widths, and cast blocks 862, 864, and 866 convert the output widths to 32 bits. The input signals to the subsystem are the three output read enable signals (ports 868, 870, and 872) from the bus, along with the output data signal and output write-enable signal from the peripheral component (ports 874 and 876). These signals are concatenated (blocks 878 and 880) and together drive the input of a ROM block 882. The ROM block is parameterized to decode the signal and drive the multiplexer select line with an appropriate value. If none of the read enable signals are asserted, the multiplexer selects the constant 32-bit zero input.

Figure 14:
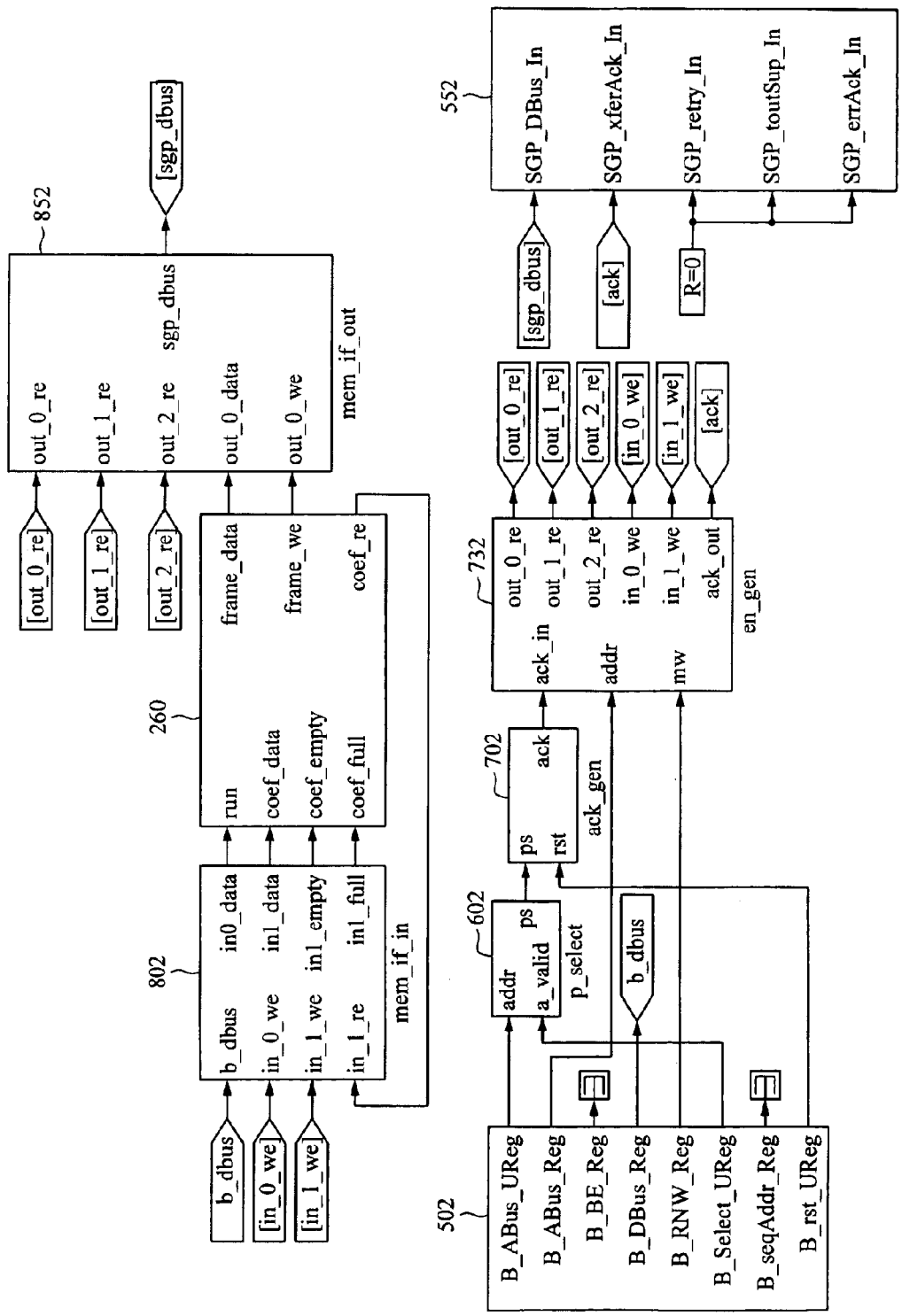
FIG. 14 is a block diagram that illustrates an example complete peripheral component.

FIG. 14 is a block diagram that illustrates an example complete peripheral component with the logic of FIGS. 5A–13B.

Figure 15B:
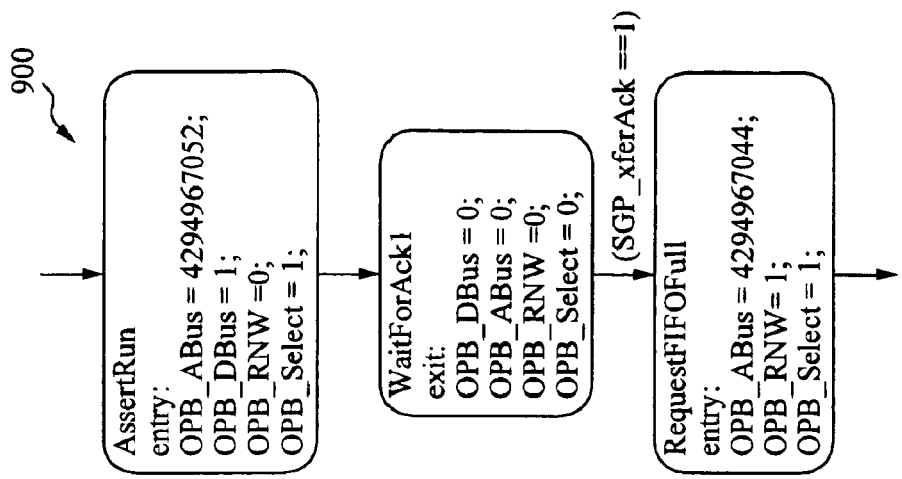
FIG. 15B illustrates state transitions modeled by block.
Figure 15A:
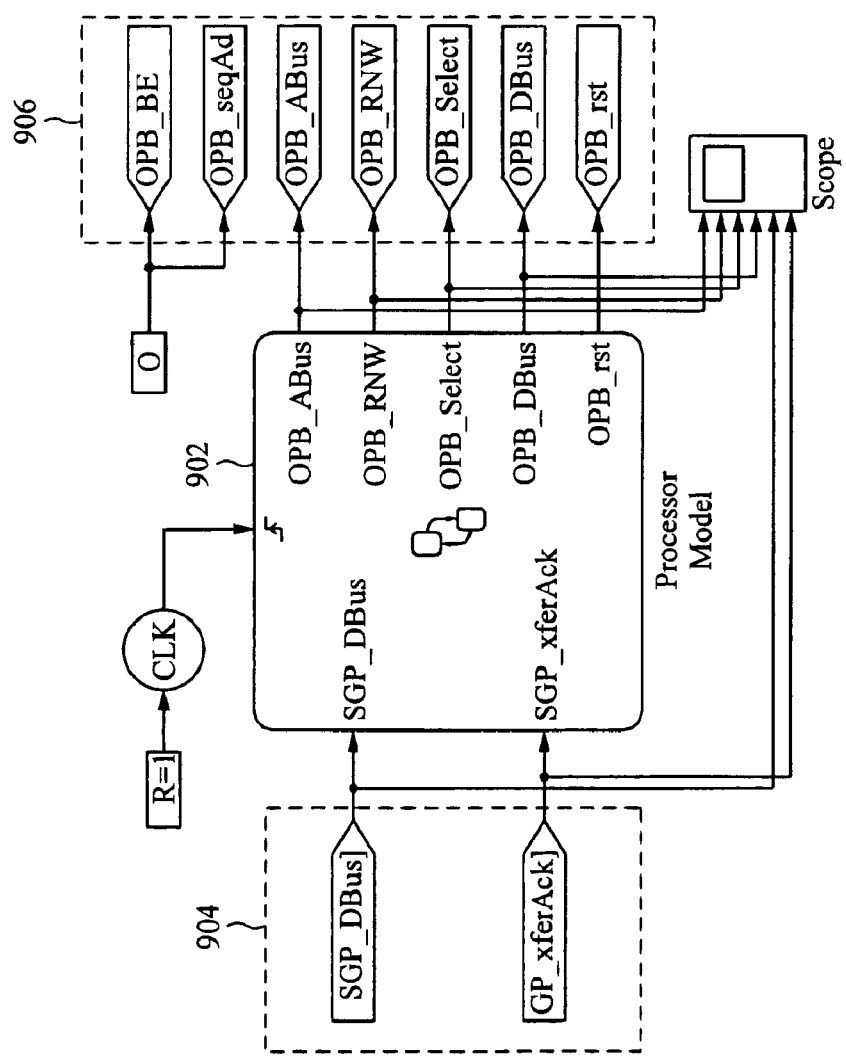
FIG. 15A is a block diagram that illustrates an example generic state machine that models bus behavior of a processor that is coupled to a bus.

FIG. 15A is a block diagram that illustrates an example generic state machine that models bus behavior of a processor that is coupled to a bus, and FIG. 15B illustrates state transitions modeled by block 902. By simulating subsets of the processor code using state transition diagrams, a user can visualize peripheral model behavior under realistic stimuli. A tool such as Stateflow from the MathWorks allows a user to model processor behavior by simulating subsets of processor code using state transition diagrams. Simulating subsets of the processor code in a tool such as Simulink allows most analysis tools from existing Simulink libraries to be used in the process of debugging the peripheral component. When the model is translated to hardware, Sysgen automatically produces a test bench that uses the bus simulation test vectors as test vectors in the hardware simulation. By running these tests, the user can be assured the hardware representation is both bit and cycle accurate when compared to the behavior of the model.

For the example filter peripheral component, a Stateflow block 902 implements a Stateflow diagram 900 of a code stub from a MicroBlaze processor. Each output of Stateflow block 902 drives a corresponding input port of the peripheral component's input bus interface subsystem. Similarly, every input of Stateflow block 902 is driven by an output port from the peripheral component's output bus interface subsystem. Abstract connections to the bus interface subsystems are realized by the Stateflow block's input and outputs driving or reading global from or goto blocks (elements in 904, 906), respectively. This approach provides encapsulation of the Stateflow block, source, and syncs into a single subsystem. Because the input and outputs are wired to global from/goto blocks, the user need only include the block in a design and tap off bus signals accordingly with additional from/goto blocks. The model monitors the bus signals driven by the peripheral via global from blocks.

The tags on the global from/goto blocks match the from/goto tags found in bus interface blocks 502 and 552. The trigger condition is the rising edge of the clock. A clock probe block extracts the system clock and drives the Stateflow block's trigger port.

The present invention is believed to be applicable to a variety of systems for creating circuit designs and has been found to be particularly applicable and beneficial in creating peripheral components for use on a bus. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A computer-implemented method for generating an electronic circuit design, comprising:

instantiating a first logic block in the design in response to user input controls, the first logic block including parameters that specify requirements of the first logic block;

providing a library of bus interface blocks that are parameterizable to connect a logic block to a bus;

automatically instantiating in the design the bus interface blocks that connect the first logic block to the bus in response to user-specified design data associated with input and output ports of the first logic block that specify requirements of the first logic block for the bus to which the first logic block is to be connected;

parameterizing the bus interface blocks in response to the requirements of the first logic block; and means for providing a state transition diagram that models embedded processor code.

2. The method of claim 1, wherein the bus interface blocks are user selectable, and the bus interface blocks are instantiated in response to interactive user input controls.

3. The method of claim 2, wherein the bus interface blocks include a first element that implements bus interface logic for reading data from and writing data to the bus.

4. The method of claim 3, wherein the bus interface blocks include a second element that implements address decode logic for detecting data addressed to first logic block.

5. The method of claim 4, wherein the bus interface blocks include a third element that implements a memory mapped interface that provide temporary storage of data received from and data sent to the bus.

6. The method of claim 5, wherein the bus interface blocks include a fourth element that implements handshake logic that generates handshake signals in association with bus transactions.

7. The method of claim 1, wherein the bus-interface blocks are interconnected in response to interactive user input controls, a selected one or more of the bus-interface blocks is connected to the first logic block in response to interactive user input controls, and the bus-interface blocks are automatically parameterized in response to requirements of the first logic block.

8. The method of claim 1, wherein the bus-interface blocks are automatically interconnected in response to requirements of the logic block, a selected one or more of the bus-interface blocks is automatically connected to the first logic block in response to requirements of the logic block, and the bus-interface blocks are automatically parameterized in response to requirements of the first logic block.

9. The method of claim 1, wherein the bus interface blocks include a first element that implements bus interface logic for reading data from and writing data to the bus.

10. The method of claim 9, wherein the bus interface blocks include a second element that implements address decode logic for detecting data addressed to first logic block.

11. The method of claim 10, wherein the bus interface blocks include a third element that implements a memory mapped interface that provide temporary storage of data received from and data sent to the bus.

12. The method of claim 11, wherein the bus interface blocks include a fourth element that implements handshake logic that generates handshake signals in association with bus transactions.

13. The method of claim 1, further comprising:

augmenting each state transition in the state transition diagram with transitions that model selected bus transactions addressed to the first logic block;

instantiating the state transition diagram in the design in response to interactive user input controls; and simulating operation of a circuit implemented according to the circuit design.

14. An apparatus for generating an electronic circuit design, comprising:

means for instantiating a first logic block in the design in response to user input controls, the first logic block including parameters that specify requirements of the first logic block;

means for providing a library of bus interface blocks that are parameterizable to connect a logic block to a bus;

means, responsive to user-specified design data associated with input and output ports of the first logic block that specify requirements of the first logic block for the bus to which the first logic block is to be connected, for automatically instantiating in the design the bus interface blocks that connect the first logic block to the bus;

means for parameterizing the bus interface blocks in response to the requirements of the first logic block; and providing a state transition diagram that models embedded processor code.

* * * * *